(12) United States Patent
Barat et al.

(10) Patent No.: US 12,314,642 B2
(45) Date of Patent: May 27, 2025

(54) SYSTEM AND METHOD FOR ACTOR BASED SIMULATION OF COMPLEX SYSTEM USING REINFORCEMENT LEARNING

(71) Applicant: Tata Consultancy Services Limited, Mumbai (IN)

(72) Inventors: Souvik Barat, Pune (IN); Harshad Khadilkar, Thane West (IN); Vinay Kulkarni, Pune (IN); Prashant Kumar, Pune (IN); Monika Gajrani, Pune (IN); Hardik Meisheri, Thane West (IN); Vinita Baniwal, Thane West (IN)

(73) Assignee: TATA CONSULTANCY SERVICES LIMITED, Mumbai (IN)

( * ) Notice: Subject to any disclaimer, the term of this patent is extended or adjusted under 35 U.S.C. 154(b) by 798 days.

(21) Appl. No.: 17/593,767

(22) PCT Filed: Apr. 21, 2020

(86) PCT No.: PCT/IB2020/053756
§ 371 (c)(1),
(2) Date: Sep. 24, 2021

(87) PCT Pub. No.: WO2020/229904
PCT Pub. Date: Nov. 19, 2020

(65) Prior Publication Data
US 2022/0180026 A1 Jun. 9, 2022

(30) Foreign Application Priority Data

May 10, 2019 (IN) .............................. 201921018794

(51) Int. Cl.
G06F 30/27 (2020.01)

(52) U.S. Cl.
CPC .................................. G06F 30/27 (2020.01)

(58) Field of Classification Search
CPC .......... G06F 30/27; G06N 20/00; G06N 3/08; G06N 3/006
See application file for complete search history.

(56) References Cited

U.S. PATENT DOCUMENTS 9,792,397 B1 10/2017 Nagaraja
10,282,512 B2 5/2019 Bennett et al.
(Continued)

FOREIGN PATENT DOCUMENTS

WO WO2013189475 A1 12/2013

OTHER PUBLICATIONS

Peng, Peng, et al. "Multiagent bidirectionally-coordinated nets: Emergence of human-level coordination in learning to play starcraft combat games." arXiv preprint arXiv:1703.10069 (2017). (Year: 2017).*

(Continued)

Primary Examiner — David A Hopkins
(74) Attorney, Agent, or Firm — FINNEGAN, HENDERSON, FARABOW, GARRETT & DUNNER LLP

(57) ABSTRACT

Generally, in complex systems such as business organizations and supply chain networks, decisions making and control are challenging due to dynamic environment thereof. The embodiments herein provide method and system that uses reinforcement learning (RL) for exploring policies and deciding control actions, and actor-based modelling and simulation for performing accurate long-term rollouts of the policies, in order to optimize operation of the complex systems. In an embodiment, a method for actor based simulation of complex system includes modeling, actors of the complex system using an actor abstraction, where actors (Continued)

includes RL agents embodied in each subsystem of the complex system, and executes micro-level interactions amongst the subsystems. An emergent macro-behavior of the complex system is simulated by the using the RL agents based on the micro-level interactions. Optimal decisions pertaining to actions of the RL agents are learnt based on the emergent macro-behavior of the complex subsystem.

12 Claims, 8 Drawing Sheets

(56) References Cited

U.S. PATENT DOCUMENTS

| | | |
|---|---|---|
| 10,752,269 B2 | 8/2020 | Govindappa et al. |
| 2018/0240043 A1 | 8/2018 | Majumdar et al. |
| 2019/0122092 A1 | 4/2019 | Haines et al. |

OTHER PUBLICATIONS

Feng, Jun, et al. "Learning to collaborate: Multi-scenario ranking via multi-agent reinforcement learning." Proceedings of the 2018 World Wide Web Conference. 2018. (Year: 2018).*
Carter, Steven Andrew. A Controller Operator Graph Model for Cooperative Multi-Agent Systems. University of Johannesburg (South Africa), 2008. (Year: 2008).*
Arokhlo, Mortaza Zolfpour, et al. "Route guidance system using multi-agent reinforcement learning." 2011 7th International Conference on Information Technology in Asia. IEEE, 2011. Abstract, § III (Year: 2011).*
Everett, Michael, Yu Fan Chen, and Jonathan P. How. "Motion planning among dynamic, decision-making agents with deep reinforcement learning." 2018 IEEE/RSJ International Conference on Intelligent Robots and Systems (IROS). IEEE, 2018. Abstract, § III (Year: 2018).*
Foerster, Jakob, et al. "Counterfactual multi-agent policy gradients." Proceedings of the AAAI conference on artificial intelligence. vol. 32. No. 1. 2018. Abstract, § 4 (Year: 2018).*
Iqbal, Shariq, and Fei Sha. "Actor-attention-critic for multi-agent reinforcement learning." International conference on machine learning. PMLR, 2019. Open-Review Version, Archive Date: Sep. 2018, accessed via URL: openreview(dot)net/references/pdf?id=B1Y9aVYpQ. Abstract, § 3 (Year: 2018).*
Jiang, Jiechuan, and Zongqing Lu. "Learning attentional communication for multi-agent cooperation." Advances in neural information processing systems 31 (2018). Abstract, §§ 3-4. (Year: 2018).*
Li, Zhipeng, et al. "Research on collaborative control method of manufacturing process based on distributed multi-agent cooperation." 2018 11th International Symposium on Computational Intelligence and Design (ISCID). vol. 2. IEEE, 2018. Abstract, §§ III-IV (Year: 2018).*
Lin, Kaixiang, Shu Wang, and Jiayu Zhou. "Collaborative deep reinforcement learning." arXiv preprint arXiv:1702.05796 (2017). Abstract, §§ 3.2, 4 and its subsections (Year: 2017).*
Lowe, Ryan, et al. "Multi-agent actor-critic for mixed cooperative-competitive environments." Advances in neural information processing systems 30 (2017). Abstract, §§ 2, 4 (Year: 2017).*
Mnih, Volodymyr. "Asynchronous Methods for Deep Reinforcement Learning." arXiv preprint arXiv:1602.01783 (2016). Abstract, § 4 (Year: 2016).*
Pan, Jie, et al. "Multisource transfer double DQN based on actor learning." IEEE transactions on neural networks and learning systems 29.6 (2018): 2227-2238. Abstract, § 3 (Year: 2018).*
Peng, Zhaoqing, Libo Zhang, and Tiejian Luo. "Multi-agent communication with attentional and recurrent message integration." 2018 IEEE Symposium on Computers and Communications (ISCC). IEEE, 2018. Abstract, §§ I, III-IV (Year: 2018).*
Raileanu, Roberta, et al. "Modeling others using oneself in multi-agent reinforcement learning." International conference on machine learning. PMLR, 2018. Abstract, § 2 (Year: 2018).*
Ryu, Heechang, Hayong Shin, and Jinkyoo Park. "Multi-agent actor-critic with generative cooperative policy network." arXiv preprint arXiv:1810.09206 (2018). Abstract, §§ 1-3 (Year: 2018).*
Sukhbaatar, Sainbayar, and Rob Fergus. "Learning multiagent communication with backpropagation." Advances in neural information processing systems 29 (2016). Abstract, § 2 (Year: 2016).*
Verma, Tanvi, Pradeep Varakantham, and Hoong Chuin Lau. "Entropy Controlled Non-Stationarity for Improving Performance of Independent Learners in Anonymous MARL Settings." vol. abs/1803. 09928 (2018). Abstract, §§ 1-2, 3.3, 4 (Year: 2018).*
Yang, Yaodong, et al. "Mean field multi-agent reinforcement learning." International conference on machine learning. PMLR, 2018. Abstract, § 3 (Year: 2018).*
Zolfpour-Arokhlo, Mortaza, et al. "Modeling of route planning system based on Q value-based dynamic programming with multi-agent reinforcement learning algorithms." Engineering Applications of Artificial Intelligence 29 (2014): 163-177. Abstract, §§ 2.1-2.2 and 3 (Year: 2014).*
Zennir, Youcef, and Denis Pomorski. "Multi-Actors distributed control systems: Reinforcement signal by Shannon's Entropy." The 24th European modeling & simulation on symposium (EMSS'12), Vienna, Austria. 2012. Abstract, §§ 2-3 (Year: 2012).*
Wang, Xuechun, et al. "An accelerated asynchronous advantage actor-critic algorithm applied in papermaking." 2019 Chinese Control Conference (CCC). IEEE, 2019. § 2.1 (Year: 2019).*
Liu, Yu, et al. "An actor-critic deep reinforcement learning based computation offloading for three-tier mobile computing networks." 2019 11th International Conference on Wireless Communications and Signal Processing (WCSP). IEEE, 2019. § III ¶ 1 (Year: 2019).*
Mustaphaa, Karam et al., "Modeling and Simulation Agent-Based of Natural Disaster Complex Systems", Procedia Computer Science, 2013, vol. 21, pp. 148-155, Elsevier, https:/reader.elsevier.com/reader/sd/pii/S1877050913008144?token=BC7B2A355770B7575970AB89DF4FBC46462164824F2E110C7AEBA5BFB658E6F489D153CD1EE34C66381804A11FD87BEF&originRegion=eu-west-1&originCreation=20210902045139.
Barat, Souvik et al., "An actor-model based bottom-up simulation—An experiment on Indian demonetisation initiative", Winter Simulation Conference (WSC), Dec. 2017, IEEE http://citeseerx.ist.psu.edu/viewdoc/download?doi=10.1.1.569.4142&rep=rep1&type=pdf.
International Search Report and Written Opinion mailed Sep. 11, 2020, in International Application No. PCT/IB2020/53756; 8 pages.

* cited by examiner

400

SYSTEM AND METHOD FOR ACTOR BASED SIMULATION OF COMPLEX SYSTEM USING REINFORCEMENT LEARNING

PRIORITY CLAIM

This present application is a U.S. National Stage Filing under 35 U.S.C. § 371 and claims priority from International Application No. PCT/IB2020/053756 filed on Apr. 21, 2020, which application claims priority under 35 U.S.C. § 119 from India Application No. 201921018794, filed on May 10, 2019. The entire contents of the aforementioned applications are incorporated herein by reference.

TECHNICAL FIELD

The disclosure herein generally relates to simulation of a complex system, and, more particularly, to system and method for actor based simulation of complex system using reinforcement learning.

BACKGROUND

A complex system is composed of a large number of subsystems that may be arranged by means of intricate relationships and interconnections. Examples of complex systems may include, but are not limited to, infrastructure such as power grid, transportation systems, communications systems, and so on and so forth. Controlling the operations of applications associated with the complex systems is a challenging task.

With the growth of technology reinforcement learning (RL), a branch of artificial intelligence (AI) has achieved a great degree of success in control applications such as online gameplay and autonomous driving. However, managing operations of business critical applications such as supply chain management using RL is a challenging task. A key aspect of using RL in the real world is to train the agent before deployment, so as to minimize experimentation in live operation. While this is feasible for online gameplay (where the rules of the game are well known) and autonomous driving (where the dynamics of the vehicle are predictable), it is much more difficult for complex systems due to associated complexities, such as uncertainty, adaptability and emergent behavior.

SUMMARY

Embodiments of the present disclosure present technological improvements as solutions to one or more of the above-mentioned technical problems recognized by the inventors in conventional systems. For example, in one aspect, there is provided a processor implemented method for actor based simulation using Reinforcement Learning. The method includes modeling, via one or more hardware processors, a plurality of actors of a complex system having a plurality of subsystems using an actor abstraction of the complex system. The plurality of actors includes a plurality of reinforcement learning (RL) agents embodied in the plurality of subsystems to execute a plurality of micro-level interactions amongst the plurality of subsystems, wherein each subsystem of the plurality of subsystems embodies a RL agent from amongst the plurality of RL agents. Also, the method includes simulating, based on the plurality of actors having the plurality of RL agents, an emergent macro-behavior of the complex system based on an observation of the plurality of micro-level interactions performed by the plurality of RL-agents, via the one or more hardware processors. Further, the method includes learning, by the plurality of RL agents, one or more optimal decisions pertaining to actions of the plurality of the RL agents embodied in the plurality of subsystems based on the emergent behavior of the complex subsystem, via the one or more hardware processors, wherein learning the one or more optimal decisions facilitates in training and validating the plurality of actors of the complex system.

In another aspect, a system for actor based simulation using Reinforcement Learning is provided. The system includes one or more memories; and one or more hardware processors coupled to the one or more memories, wherein the one or more hardware processors are configured to execute programmed instructions stored in the one or more memories to model a plurality of actors of a complex system having a plurality of subsystems using an actor abstraction of the complex system. The actor abstraction of the complex system includes a plurality of reinforcement learning (RL) agents embodied in the plurality of subsystems to execute a plurality of micro-level interactions amongst the plurality of subsystems, wherein each subsystem of the plurality of subsystems embodies a RL agent from amongst the plurality of RL agents. Also, the one or more hardware processors are configured to execute the programmed instructions to simulate, by using the plurality of actors having the plurality of RL agents, an emergent macro-behavior of the complex system based on an observation of the plurality of micro-level interactions performed by the plurality of RL-agents. Further, the one or more hardware processors are configured to execute the programmed instructions to learn, by the plurality of RL agents, one or more optimal decisions pertaining to actions of the plurality of the RL agents embodied in the plurality of subsystems based on the emergent macro-behavior of the complex subsystem, wherein learning the one or more optimal decisions facilitates in training and validating the plurality of actors of the complex system.

In yet another aspect, a computer program product including a non-transitory computer readable medium having a computer readable program embodied therein is provided. The said computer readable program, when executed on a computing device, causes the computing device to model a plurality of actors of a complex system having a plurality of subsystems as an actor abstraction of the complex system. The plurality of actors includes a plurality of reinforcement learning (RL) agents embodied in the plurality of subsystems to execute a plurality of micro-level interactions amongst the plurality of subsystems, wherein each subsystem of the plurality of subsystems embodies a RL agent from amongst the plurality of RL agents. Also, the computer readable program, when executed on the computing device, causes the computing device to simulate, by using the plurality of actors having the plurality of RL agents, an emergent macro-behavior of the complex system based on an observation of the plurality of micro-level interactions performed by the plurality of RL-agents. Further, the computer readable program, when executed on the computing device, causes the computing device to learn, by the plurality of RL agents, one or more optimal decisions pertaining to actions of the plurality of the RL agents embodied in the plurality of subsystems based on the emergent macro-behavior of the complex subsystem, wherein learning the one or more optimal decisions facilitates in training and validating the plurality of actors of the complex system.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Figure 1:
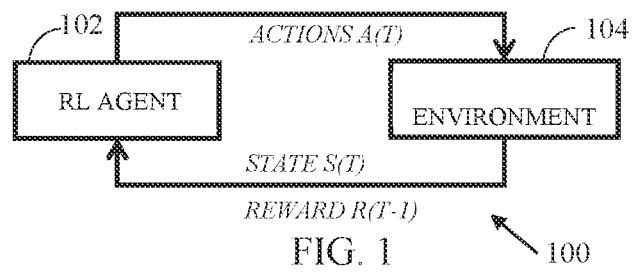
FIG. 1 illustrates an example set-up of a Reinforcement Learning (RL) agent for actor based simulation using RL, according to some embodiments of the present disclosure.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Complex systems are typically modelled using two broad categories of approaches: top-down approach and bottom-up approach. A top-down approach visualizes a system from a higher scale and specifies aggregated macro-behavior. This approach uses a range of models, such as mathematical/analytical model and enterprise model (EM), to represent and analyze the system as a whole. The analytical models, e.g., Mixed Integer Linear Programming, represent a system using mathematical formulae and use rigorous mathematical and statistical problem solving techniques for system analysis. The operational research techniques are the specialized form of analytical models. The enterprise models, such as ArchiMate™, BPMN™ and System Dynamics, also serve a wide range of modelling and analysis needs by representing aggregated system behavior. However, these approaches are found to be inadequate to represent systems (and their transition functions P) that contain multiple adaptable, self-organizing and uncertain entities (such as warehouses, trucks, products and store in case the system represents a supply chain management system), individualistic behavior (such as product expiry) and exhibit emergent behaviors (such as availability, unavailability and damages of products that are significantly influenced by several uncertain spatio-temporal aspects: transportation delay, inappropriate packaging with certain class of products, availability of other similar products, and so on).

Reinforcement Learning (RL) is a class of machine learning models that can be used for controlling complex systems in an adaptive and flexible manner. In particular, RL is a framework for developing computer agents that can learn an optimal behavior by relating generic reward signal with its past actions. The agents learn how to behave in an environment by performing actions and seeing results thereof. In particular, the agents interact with the environment, and receive awards for performing actions.

The RL framework may include an RL agent/controller and a plurality of RL agents. The goal of the RL agent/controller is to learn to take the best possible control actions in each possible state of the system, in order to maximize long-term system objectives. A crucial aspect of RL is the computation of next state and associated rewards for the chosen action(s), in a closed loop to enable learning.

Referring now to the drawings, and more particularly to FIG. 1 through FIG. 10, where similar reference characters denote corresponding features consistently throughout the figures, there are shown preferred embodiments and these embodiments are described in the context of the following exemplary system and/or method.

FIG. 1 illustrates an example set-up 100 of a RL agent, in accordance with an embodiment of the present disclosure. The set-up 100 is shown to include an RL agent 102 and an environment 104 with which the RL agent 102 interacts. At each time step t, the environment 104 communicates a current state s(t) of the complex system and the step reward r(t−1) received in the last time step (t−1). Based on a history of inputs over time, the RL agent computes the next action a(t) to be considered.

However, computing the next state and reward for a selected action and understanding long term consequences of a series of actions for a business-critical system is challenging as these systems are often exceedingly complex. Fundamentally, these systems are open as they exchange messages with their environment, and complex as they contain multiple non-linear feedback loops, which may lead to a butterfly effect. Moreover, these systems are not monolithic deterministic automatons, but are complex (scale-free) networks or systems of systems, where the global behaviors emerge from the interactions of autonomous, adaptable, and self-organizing sub-systems and constituent agents. Typically, use of analytical expressions for modelling systems (which is a requirement for exact optimization approaches such as Mixed Integer Linear Programming and also the method of choice for simpler RL applications), are infeasible for complex systems.

A reinforcement learning problem is described by a Markov Decision Process (MDP) represented by a tuple (S, A, R, P, γ). Here, S is the set of states of the system, and can be countably or uncountably infinite in complex systems, A is the set of control actions that the RL agent can choose from, R is the set of possible rewards, P is the (possibly stochastic) transition function from $\{S, A\} \rightarrow S$, and γ is a discount factor for future rewards. In several cases, the agent is unable to observe the state space entirely, resulting in a partially-observable MDP (POMDP). A set of observations O is derived from S to represent what the agent can sense. The goal of the RL agent is to compute a policy $O \rightarrow A$ that maximizes the future discounted long-term reward. Hence, an accurate representation of the transition function P: $A \rightarrow O$ is a critical aspect of this effort.

The task of computing/predicting the system state s(t) and corresponding rewards r(t) can be accomplished by one of the three approaches: inferential approach, experimental approach, and modelling and simulation approach. The inferential approach analyses the existing system data (i.e., trace or historical data) to infer the characteristics of a system and compute next possible states. The experimental approach attempts to understand the impact of an action a(t) by applying it in a controlled environment of an actual system and observing its effects over time. The modelling and simulation approach, in contrast, imitates a real system using a (purposive) model, explores a range of scenarios by simulating the system model (with/without actions) and observes simulation results to predict the next state and rewards.

Conventional techniques describe the use of RL for controlling complex systems, typically for systems which can be modelled analytically, simplifying the computation of step rewards and next state of the system. This is because RL is effective only when the (stochastic) transition functions closely approximate the real system to be controlled. In situations where the system cannot be described analytically, algebraic expressions cannot be used to compute rewards and transitions. An experimental approach can be used for training the RL agent when the system is nonphysical (for example, when the system is itself a piece of software as in the case of computer games). However, training on the actual system is not feasible in the case of business-critical systems. Therefore, the development of (and integration with) a high-fidelity simulation model is crucial for effective training of the RL agent and controlling complex systems.

Various embodiments disclosed herein overcome the aforementioned limitations associated with RL based simulation of complex systems. For example, in an embodiment, a method and a system for simulation of complex system using RL by an agent/actor based modelling abstraction are disclosed. The actor based modeling abstraction acts as an effective modelling aid to understand the dynamics of such complex systems. In an embodiment, a system is presented that utilizes reinforcement learning for exploring policies and deciding control actions, and actor-based modelling and simulation for performing accurate long-term rollouts of the policies, in order to optimize the operation of complex systems. Herein, the term 'policy' refers to a rule or a set of rules that may define the strategies of a RL agent to behave in a specific way.

In an embodiment, an actor model based simulation system is disclosed for sufficiently training a RL agent and validating new policy in a synthetic environment. An example of an actor and a process flow for the disclosed actor model based simulation system having two control loops are described further with reference to FIGS. 5A and 5B, respectively.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments. It is intended that the following detailed description be considered as exemplary only, with the true scope being indicated by the following claims.

Figure 2:
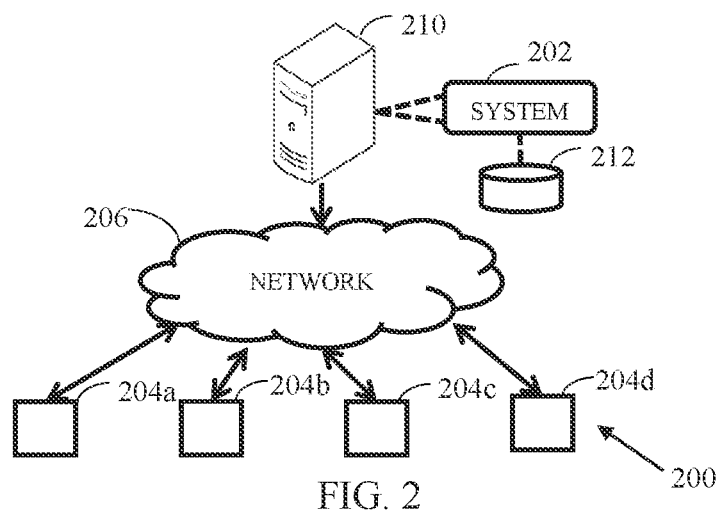
FIG. 2 illustrates a network environment implementing a system for actor based simulation using RL, according to some embodiments of the present disclosure.

FIG. 2 illustrates a network environment 200 implementing a system 202 for actor based simulation using Reinforcement Learning, according to an embodiment of the present subject matter. In one example embodiment, the system 202 includes an actor model to closely mimic a complex system; adopt simulation as an aid to compute micro-behaviors of various actors; and observe emerging macro behaviors (of the system), overall system state and rewards; and use RL agent as the primary computing machinery for deriving suitable actions over time. The details of the actor modeling of complex system and RL agents are described further in the description below.

Figure 3:
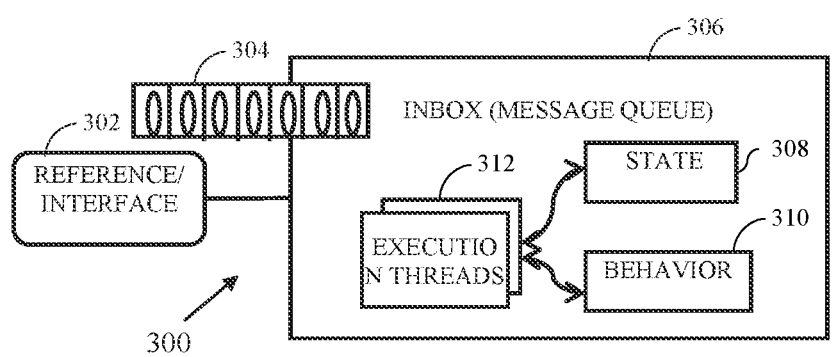
FIG. 3 illustrates elements of an actor for actor based simulation using RL, in accordance with an example embodiment of the present disclosure.

In an embodiment, the system 202 may model an actor abstraction of the complex system by embodying an RL agent in each subsystems of the complex system. The system observes micro-behaviors exhibited by the system using a collection of interacting actors and help to observe emergent macro-behavior at higher levels of abstraction. The agent and actor based technologies, such as Erlang™, Scala Actor™ and Akka™, realise system as set of autonomous, self-contained, and reactive actors. Each actor has an interface as an identity, an inbox or message queue for communication or interactions, and an encapsulated computing unit as shown in FIG. 3. The computing unit contains actor's state, behavior and a set of execution threads. In a system, these actors concurrently execute their (micro)-behaviors, change their states, create new actors and interact with each other through asynchronous messages to produce system-level macro-behavior.

The system 202 can be accessed by multiple devices and/or machines 204-a, 204-b . . . 204-d, collectively referred to as devices 204 hereinafter. Examples of the devices 204 may include, but are not limited to, a portable computer, a personal digital assistant, a handheld device, storage devices, and so on. The devices 204 are communicatively coupled to the system 202 through a network 206, and may be accessible by the system 202.

In one implementation, the network 206 may be a wireless network, a wired network or a combination thereof. The network 206 can be implemented as one of the different types of networks, such as intranet, local area network (LAN), wide area network (WAN), the internet, and the like. The network 206 may either be a dedicated network or a shared network. The shared network represents an association of the different types of networks that use a variety of protocols, for example, Hypertext Transfer Protocol (HTTP), Transmission Control Protocol/Internet Protocol (TCP/IP), Wireless Application Protocol (WAP), and the like, to communicate with one another. Further the network 206 may include a variety of network devices, including routers, bridges, servers, computing devices, storage devices, and the like.

In an embodiment, the system 202 may be embodied in a computing device 210. Examples of the computing device 210 may include, but are not limited to, a desktop personal computer (PC), a notebook, a laptop, a portable computer, a smart phone, a tablet, and the like. The system 202 may also be associated with a data repository 212. The data repository 212 may be configured to store data and/or information generated during actor based simulation of the complex system using RL. The data repository 212 may be configured outside and communicably coupled to the computing device 210 embodying the system 202. Alternatively, the data repository 212 may be configured within the system 202.

Although the present subject matter is explained considering that the system 202 is implemented for a complex system such as supply chain management, it may be understood that the system 202 may is not restricted to any particular machine or environment. The system 202 can be utilized for a variety of domains where actor based simulation using RL is involved. The system 202 may be implemented in a variety of computing systems, such as a laptop computer, a desktop computer, a notebook, a workstation, a mainframe computer, a server, a network server, and the like.

Referring now to FIG. 3, elements of an actor 300 are illustrated in accordance with an example embodiment. The actor 300 includes an interface 302 as an identity, an inbox or message queue 304 for communication or interactions, and an encapsulated computing unit 306 as shown in FIG. 3. The computing unit 306 contains actor's state 308, behavior 310 and a set of execution threads 312. In a system, the actors such as the actor 300 concurrently execute their (micro)-behaviors, change their states, create new actors and interact with each other through asynchronous messages to produce system-level macro-behavior. A flow diagram illustrating a method for actor based simulation using Reinforcement Learning is described further with reference to FIG. 4.

Figure 4:
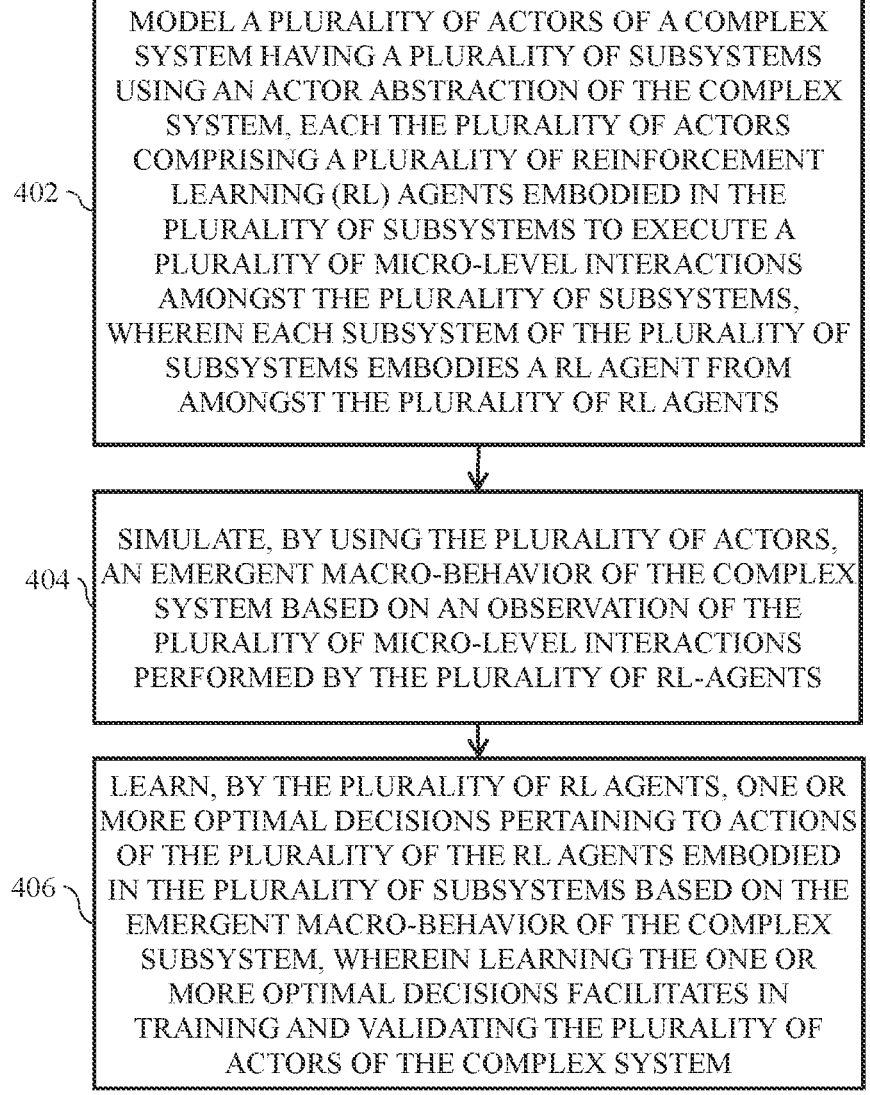
FIG. 4 illustrates a flow diagram of a method for actor based simulation using Reinforcement Learning, in accordance with some embodiments of the present disclosure.
Figure 10:
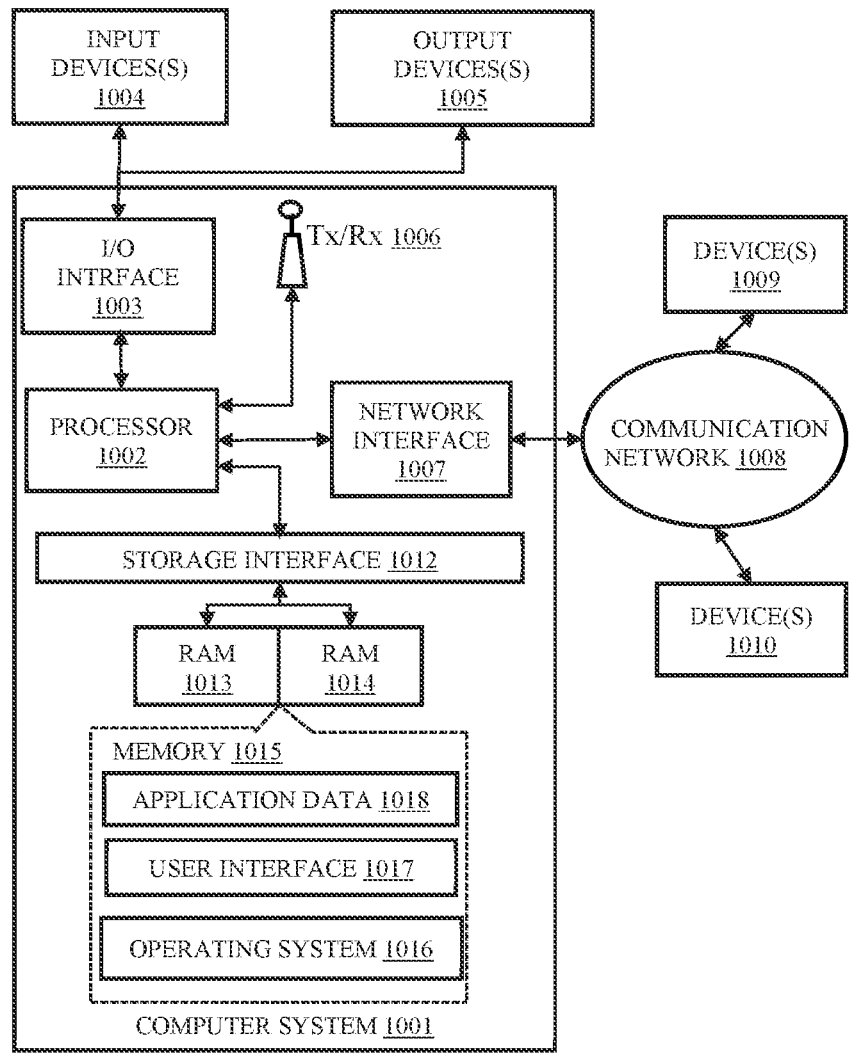
FIG. 10 illustrates a block diagram of a system for actor based simulation using Reinforcement Learning, in accordance with some embodiments of the present disclosure.

FIG. 4 illustrates a flow diagram of a method 400 for actor based simulation using Reinforcement Learning, in accordance with an example embodiment. The method 400 may be described in the general context of computer executable instructions. Generally, computer executable instructions can include routines, programs, hands, components, data structures, procedures, modules, functions, etc., that perform particular functions or implement particular abstract data types. The method 400 may also be practiced in a distributed computing environment where functions are performed by remote processing devices that are linked through a communication network. The order in which the method 400 is described is not intended to be construed as a limitation, and any number of the described method blocks can be combined in any order to implement the method 400, or an alternative method. Furthermore, the method 400 can be implemented in any suitable hardware, software, firmware, or combination thereof. In an embodiment, the method 400 depicted in the flow chart may be executed by a system, for example, the system 102 of FIG. 1. In an example embodiment, the system 102 may be embodied in an exemplary computer system, for example computer system 1001 (FIG. 10).

At 402, the method 400 includes modeling a complex system having a plurality of subsystems as a plurality of actors using an actor abstraction of the complex system. In an embodiment, the complex system may include a plurality of subsystems. For instance, a complex system such as a supply chain which may include multiple interconnected subsystems, such as warehouses, stores, trucks, and store shelves, and several individualistic elements, such as products, labors and customers. Each of these subsystems and elements may have composition structure, behavior and state thereof. In an embodiment, the plurality of subsystems may occur in multiple levels. For instance, in a first level the complex system may include a first set of subsystems, in a second level one or more of first set of subsystems may further be split into a second set of subsystems, in third level one or more of previous sets (for example second and/or third set) of subsystems may be split into a third set of subsystems, and so on.

In the present scenario of a complex system, the emergent behavior is highly unpredictable and possibly chaotic, and hence said behavior cannot describe normal and/or abnormal behavior of the system up front. Therefore, in an embodiment, the complex system is modeled using an actor abstraction of the complex system for sufficiently training RL agents and validating new policy (or policies) in a synthetic environment. The plurality of actors of the complex system includes a plurality of reinforcement learning (RL) agents embodied in the plurality of subsystems to execute a plurality of micro-level interactions amongst the plurality of subsystems. It will be understood that each subsystem of the plurality of subsystems embodies a RL agent from amongst the plurality of RL agents. Based on a large number of unpredictable smaller interactions or micro-level interactions between the subsystems, each RL agent observes emergent behavior of a complex system. In an embodiment, the plurality of micro-level interactions between the plurality of RL agents includes changing of states of one or more actors, creating new actors and the one or more actors interacting with other actors through asynchronous messages. In an embodiment, the changing of the state of the one or more subsystems of the plurality of subsystems represented as actors is based on one or more of spatio-temporal conditions and/or constraints of the one or more subsystems. An example of modeling an actor using an actor abstraction of the complex system and spatio-temporal constraints imposed are described further with reference to FIGS. 5A and 5B.

At 404, the method 400 includes simulating, by using the actor abstraction of the complex system, an emergent macro-behavior of the complex system based on an observation of the plurality of micro-level interactions performed by the plurality of RL-agents. In an embodiment, the actor abstraction of the complex system is simulated by a digital twin of the complex system where each component of the disclosed digital twin is infused with intelligence (by embodying an RL agent in therein) so that the components of the digital twin themselves 'learn' to take globally optimal decisions without any external control or manual intervention. The digital twin trains the RL agents on how to control the system and compute decisions that may lead to global optimality. The RL agent based digital twin utilizes a reward technique to indicate to a control mechanism of the system whether its actions are optimal or sub-optimal. In an embodiment, based on the actors of the complex system, subsequent states and rewards of the plurality of actors are predicted to obtain predicted states and rewards. It will be understood that a reward is a function of previous actions and evolution of states. Further a transition mapping is computed from control actions and current states of the plurality of actors to the predicted states and rewards that maximizes future discounted long-term reward. The rewards and transition mapping for maximizing future discounted long-term reward are described further with reference to FIGS. 5A and 5B (refer, Equation (1)).

At 406, the method 400 includes learning, by the plurality of RL agents, one or more optimal decisions pertaining to actions of the plurality of the RL agents embodied in the plurality of subsystems based on the emergent behavior of the complex subsystem. Herein, learning the one or more optimal decisions facilitates in training and validating the actor abstraction of the complex system. The actor model based simulation system for actor based abstraction of the complex system is described further with reference to FIGS. 5A and 5B.

Figure 5A:
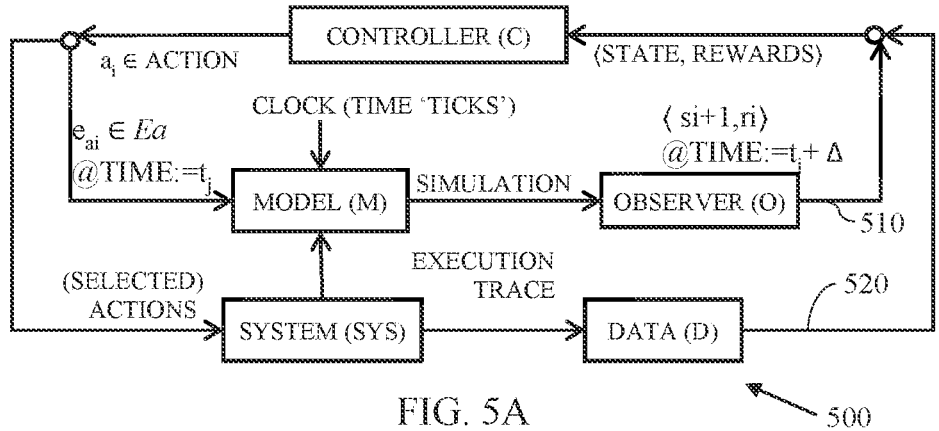
FIG. 5A illustrates an example process flow for an actor model based simulation, in accordance with some embodiments of the present disclosure.
Figure 5B:
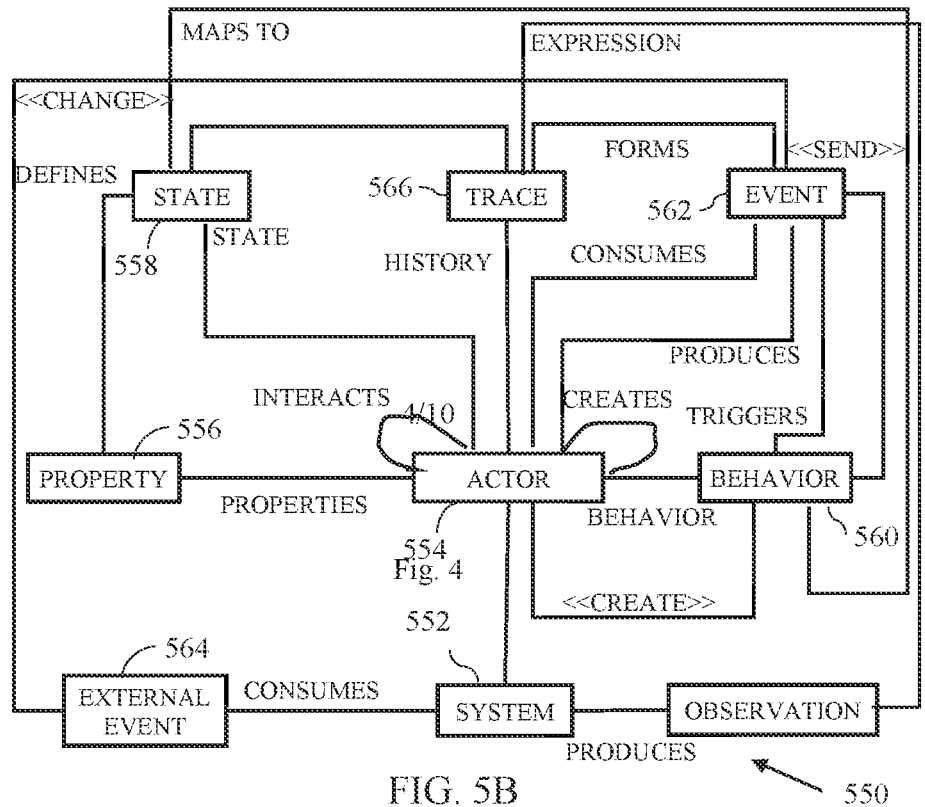
FIG. 5B illustrates a meta-model representing systems using an extended form of an actor, in accordance with some embodiments of the present disclosure.

FIGS. 5A and 5B illustrate an actor based abstraction of a complex system using RL in accordance with an example embodiment. Particularly, FIG. 5A illustrates an example process flow 500 for an actor model based simulation, and FIG. 5B illustrates a meta-model 550 representing systems using an extended form of an actor. The process flow 500 is shown to include two control loops, namely, a first loop 510 which is a model centric loop for training of RL agent and evaluation of new policies prior to their implementation in a real system; and a second loop 520 which is a real time control loop that includes real system. The meta-model 550 represents complex systems using an extended form of an actor for actor model based simulation system. Here, a system 552 is a set of Actors, for example, actor 554, whose characteristics can be described using a set of variables or Properties 556. Each Actor has its own State and Behavior. For example, the Actor 554 has its state 558 and behavior 560. The Actors (such as the actor 554) interact with other Actors by consuming and producing Events, for example Event 562, where an incoming (i.e., consumed) Event 564 may trigger a Behavior unit (represented by Behavior 560) that can change the state of an Actor (for example the Actor 554), send Events and create new Actors.

The aforementioned canonical form of an Actor is extended with a notion of Trace (a sequence of information about State and Events), for example a Trace 566, and an explicit construct to describe uncertainty in behavioral specification (as shown in the abstract syntax below). Formally, an actor ($\mathcal{ACT}$) is a five-tuple: $\langle S, \varepsilon C, \varepsilon P, Tr, B \rangle$ where, S A set of labels that represent States of an Actor.
εC A finite set of Events that an Actor can consume.
εP A finite set of Events that an actor can produce. Here, εC and εP are not disjoint set (Events εC∪εP are consumed within an actor).
Tr A finite sequence of a tuple, where each tuple captures consumed Event, corresponding State and produced Event, $$s0 \xrightarrow{ec_0} \langle s1, Eps1 \rangle \xrightarrow{ec_1} \langle s2, Eps2 \rangle \ldots \xrightarrow{ec_{(k-1)}} \langle sk, Epk \rangle,$$

where
i.e. $\{e_{c1}, \ldots ec_{(k-1)}\} \in \varepsilon C$ and $E_{ps1}, \ldots, E_{pk} \subseteq \varepsilon P$
B A set of behavioral units. It is considered that every behavioral unit B∈B is a set of programs that contain a sequence of stochastic statements. An abstract syntax to specify these programs is presented below:

| 1 | stmt :: = become( $state_{new}$ ) | State change of an actor |
|---|---|---|
| 2 | \| send( eventi , ACT $_k$ ) | Send event to an actor |
| 3 | \| create ACT ( $state_{init}$ ) | Create new actor |
| 4 | \| $e_1$: $stmt_1$+ . . . $+e_n$ : $stmt_n$ | Guarded statements |
| 5 | \| probably($e_{prop}$ ): stmt | Probabilistic statement |

Figure 6A:
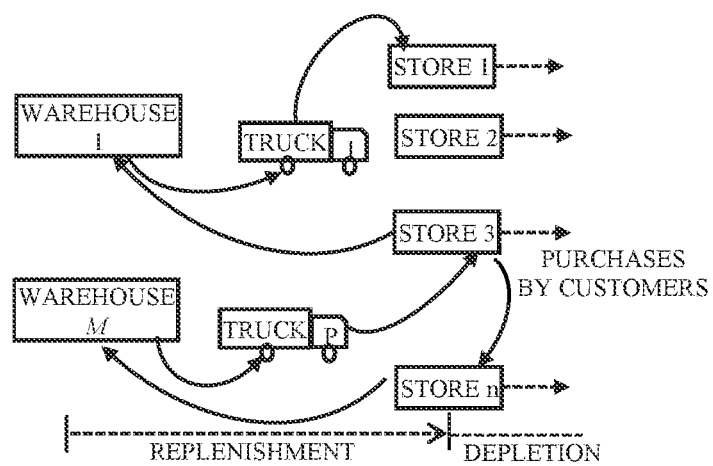
FIG. 6A illustrates a schematic representation of the flow of products in a complex system represented by a supply chain management scenario, in accordance with some embodiments of the present disclosure.

An example scenario illustrating actor based simulation of a complex system using Reinforcement Learning is described further with reference to FIGS. 6A-9B. The complex system considered in the present scenario represents a supply chain network, for example a supply chain network 600 (FIG. 6A). In the present example scenario, a generic RL problem is illustrated in the context of supply chain replenishment, which presents well-known difficulties for effective control. The scenario is that of a grocery retailer with a network of stores and warehouses served by a fleet of trucks for transporting products. A schematic representation of the flow of products in the supply chain management scenario 600 is shown in FIG. 6A. The goal of replenishment is to regulate the availability of the entire product range in each store at all times, subject to the spatio-temporal constraints imposed by (i) available stocks in the warehouses, (ii) labor capacity for picking and packaging products in the warehouses, (iii) the volume and weight carrying capacity of the trucks, (iv) the transportation times between warehouses and stores, (v) the product receiving and unloading capacity of each store, and (vi) available shelf space for each product in each store.

Figure 6B:
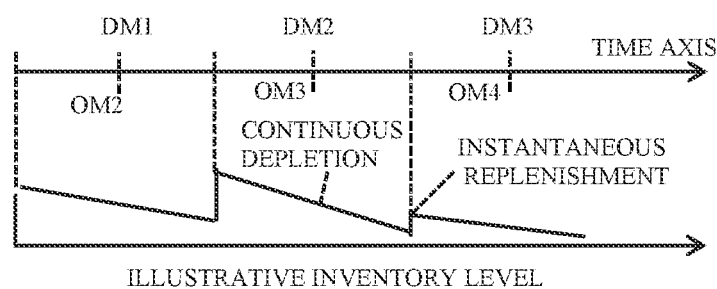
FIG. 6B illustrates a temporal illustration of a replenishment process of the supply chain management scenario of FIG. 6A, in accordance with some embodiments of the present disclosure.

A typical retailer could have tens of warehouses, thousands of stores, thousands of trucks, and a hundred thousand unique product types within its network. A temporal illustration of the replenishment process 610 is shown in FIG. 6B. The replenishment of inventory is assumed to take place periodically (typically every 6 hours), at the time instants marked as DM (Delivery Moments). However, since it takes a non-zero amount of time to procure the new inventory within the warehouse, to transport it to the store, and to load it onto the shelves, the replenishment quantities of each product are computed at the time instants marked OM (Order Moments). There is a lead time Δ provided between each OM and the subsequent DM. The inventory of products is a monotonic non-increasing function between delivery moments, and there is a step increase at every DM when new inventory is provided to the stores.

According to the notation in FIG. 6A, it may be assumed that there are m warehouses, p trucks, and n stores in a supply chain. The warehouses stock a range of products and supply them to the stores as part of the replenishment process described in FIG. 6B. These warehouses adopt policies to pack the products to the trolleys, load packed products to the trucks/carriers and deliver them to respective stores using efficient and optimum routing strategy. The product packaging and loading to the trucks are often constrained by the warehouse labors, machines capacity and number of trucks.

The uncertainties that emerge due to the probabilistic behaviors of the individual elements are: unavailability and productivity of the labors, sub-optimal machine throughput and unavailability and unaccounted delays of the trucks. Trucks are constrained by the volume and weight capacities, often they are suited for specific types of products and each of them has probabilistic characteristics, such as: propensity for transportation delay and break down. The product types are also characterized by shelf-life and propensity for damage (when they are packed with other product types and transported in specific carrier/truck). These characteristics define the state of the individual product (e.g., damaged, expired, in store, and so on) and significantly impact the replenishment process and the overall state of the stores, e.g., availability, non-availability and wastage of products at stores at specific moment. From operational perspective, each store stocks i={1, . . . k} unique varieties of products, each with a maximum shelf capacity $c_{i,j}$ where j≤n is the index of the store. Further, the inventory of product i in store j at time t is denoted by $x_{i,j(t)}$. The replenishment quantities (actions) for delivery moment d are denoted by $a_{i,j(td)}$, and are to be computed at time $(t_d-\Delta)$. The observation $O(t_d-\Delta)$ consists of the inventory of each product in each store at the time, the demand forecast for each product between the next two delivery moments, and meta-data such as the unit volume $v_i$ and weight $w_i$ of each product, and its shelf life $l_i$. It will be noted herein that the states differ from the observations in this case because the actual inventory at the time of replenishment is $x_{i,j(td)}$, which must be estimated based on the current inventory $x_{i,j(td-\Delta)}$ and some forecast of the depletion in the remaining time $\Delta$. The inventory $x_{i,j(t)}$ depletes between two delivery moments (d−1) and d, and undergoes a step increase by amount $a_{i\ j(td)}$ at time $t_d$. The actions are constrained by the various capacities in the system, including those within warehouses, in the transportation network, and in the store. The agent-based simulation (described below) computes the transition mapping P from the actions and current states to their future values.

The reward $r(t_d-1)$ is a function of the previous actions $a_{i,j(td-1)}$ and the evolution of inventory states $x_{i\ j(t)}$ in $t\in[t_{d-1}, t_d)$. From a business perspective, two quantities may be of particular interest: (i) the number of products that remain available throughout the time interval $(t_{d-1}, t_d)$, and (ii) the wastage of any products that remain unsold past their shelf lives. Mathematically, this is defined as, $$r(t_{d-1}) = 1 - \frac{count(x_{i,j} < p)}{kn} - \frac{\sum_{i=1}^{k}\sum_{j=1}^{N} w_{i,j}(t_{d-1})}{\sum_{i=1}^{k}\sum_{j=1}^{n} X_{i,j}} \quad (1)$$

where $count(x_{i,j}<\rho)$ is the number of products that run out of inventory (drop below fraction φ at some time $t \in t_{d-1}, t_d$), $w_{i,j(td-1)}$ is the number of units of product i in store j that had to be discarded in the time interval because they exceeded their shelf lives, and $X_{i,j}$ is the maximum shelf capacity for product i in store j.

Since both negative terms in (1) fall in the range [0, 1], it is seen that $-1 \leq r(t_{d-1}) \leq 1$.

In conformance with the meta-model presented in FIG. 5B, the system can be formally described as a quadruple M= $\langle \mathcal{A}C\mathcal{T}, \varepsilon\mathcal{A}, CLK, O \rangle$, where $\mathcal{A}C\mathcal{T}$ is a finite but dynamic set of actors; $\varepsilon\mathcal{A}$ is a fixed and finite set of external Events, which are triggered from external sources; CLK is a clock that triggers virtual time Events or simulation 'ticks' (as external events) to progress simulation; and O is a set of observations. An observation is a tuple (AS, Fact), where AS is a set of actor states and Fact are temporal expressions on actor traces (e.g., occurrence of events over time).

The aforementioned actor based system model (M) is considered as a synthetic environment for reinforcement learning based control setup (as described in FIG. 2). The control setup is formally defined as a quadruple $C_{SYS}=\langle SYS, M, C, M\mathcal{A}\mathcal{P}\rangle$, where SYS is the system to be controlled, M is model of system SYS, C is a controller and $M\mathcal{A}\mathcal{P}$ mapping function that transforms controller actions (A) to external events $\varepsilon\mathcal{A}$ of model M and controller actions to implementable system actions. Two critical aspects of the control system $C_{SYS}$ are (1) computation of O→$\mathcal{A}$ using controller C, and (2) computing $\mathcal{A}$→O using actor model based simulation, as described below.

Computation of O→$\mathcal{A}$ using controller C: As explained in previously, the latest observation $O(t_d-\Delta)\in O$ is received at a time $\Delta$ units before the actual time of delivery, and is to be used for computing the actions $a_i$ j(td). The observations consist of the inventories at time $(t-\Delta)$, the order forecast (expected depletion) fi, j in the next time period, and product meta-data such as unit volume $v_i$, unit weight $w_i$, and the shelf life $l_i$. Evidently, there are at least five input variables per product, leading to a total input size of 5kn. The output size is equal to kn, and each output variable can take any value between 0 and $X_{i,j}$. The number of variables in computing such a mapping directly using reinforcement learning is infeasibly large, given that k≤10000 and n≈1000 are commonly seen in the retail domain. Therefore, this mapping is computed iteratively, one product at a time.

The five variable types provided in the observation can be regarded as raw inputs. These variables are augmented by a derived input=$\Sigma_{i,j}f_{i,j}$, which is the sum of the demand forecast for all products in the supply chain. Intuitively, ρ approximates the capacity utilization of the system as a whole, and the RL agent is expected to treat it as an inhibitor: if the value of ρ is high, the RL agent should learn to send smaller quantities of each product (or to prioritize the products that are running low). A vector of size six is obtained for each product, given by $[x_{i,j}(t_d-\Delta), f_{i,j(td)}, v_i, w_i, l_i, \rho]$. This forms the input of the RL agent, while the replenishment action $u_{i,j}(t_d)$ forms the output.

A form of reinforcement learning known as Advantage Actor Critic™ (A2C) is utilized to compute the actions. The Critic™ evaluates the goodness of the current system state, while the Actor chooses an action that maximizes the improvement in value in the next state. The Actor neural network has 6 inputs, two hidden layers with 8 and 10 neurons respectively, and an output layer with 11 neurons that represent discretized and normalized actions between 0 and 1. The Critic network has the same 6 inputs, a single hidden layer with 4 neurons, and 1 output neuron representing the expected value of the current input vector. The A2C setup was implemented using Python™ with Keras™ and Tensorflow™ libraries. The basic reward function given in (1) was augmented for the purposes of training the agent, by a penalty on any actions that could not be feasibly implemented in the system because of capacity exceedance. This allows the RL agent to relate the effect of individual decisions on the net system reward.

Computing $\mathcal{A}$→O using actor model based simulation: The computation of O∈O about the actor states and events pattern on actor traces through simulation (e.g., number of products wasted due to the shelf life expiry between two time events). As shown in Algorithm 1 below, all actors of an initial model ($M_{init}$) are instantiated to a random state or a system state to initialize a simulation. Actors execute their behaviors in their respective threads, interact with each other through actor events, change their states (possibly several times to respond to external and internal events) and create new actors. The external events that include time 'tick' and events corresponding to the RL actions are propagated to all relevant actors and allowed them to react for time duration $\Delta$ before the emergent states and traces are observed. The observed and computed O is then notified to the controller to compute the next RL action.

| Algorithm 1 Compute observations using Actor Simulation |
| --- |
| 1: procedure SIMULATE($M_{init}$, D, Δ) |
| 2: ▷ Simulation duration: D and observation interval: Δ |
| 3: interval := 0, time := 0, state := Active |
| 4: ∀ $ACT_i$ ∈ $\mathcal{A}$ C $\mathcal{T}$ create $ACT_i(s_0)$ ▷ Initiate simulation by instantiating actors to system states or random states |
| 5: while (time != D) do     ▷ Simulate for D time duration |
| 6: receive(eventext)     ▷ M receives an external event |
| 7: if ($event_{ext}$ is 'tick') then     ▷ If event is a time event |
| 8: time := time + 1 |
| 9: if (state := Active) then |
| 10: ∀ $a_i$ ∈ $\mathcal{A}$ C $\mathcal{T}$ send(eventext ,ai)     ▷ Broadcast time event |
| 11: if (interval = Δ) then |
| 12: interval := 0 |
| 13: O := observe(M)     ▷ Compute O from all S and T r of $\mathcal{A}$ C $\mathcal{T}$ |
| 14: notify(O, C)     ▷ Notify ⟨statei ,r ewardi⟩ to C |
| 15: state := Pause     ▷ Pause time event for RL agent |
| 16: else |
| 17: interval := interval + 1 |
| 18: if ($event_{ext}$ ∈ $\varepsilon^{\mathcal{A}}$) then     ▷ If event is a RL Agent action |
| 19: state := Active     ▷ Restart time event for next observation |
| 20: for $a_i$ ∈ $\mathcal{A}$ C $\mathcal{T}$ (of M) do |
| 21: if (∃ $e_x$ such that $e_x$ ∈ ε C of $ACT_i$ AndnjnbM |
| 22: map($e_{ext}$ ,$event_x$ ) ∈ $M^{\mathcal{A}}$P) then |
| 23: send($e_x$ ,$a_i$ )     ▷ Send event to relevant actors |

Figure 7:
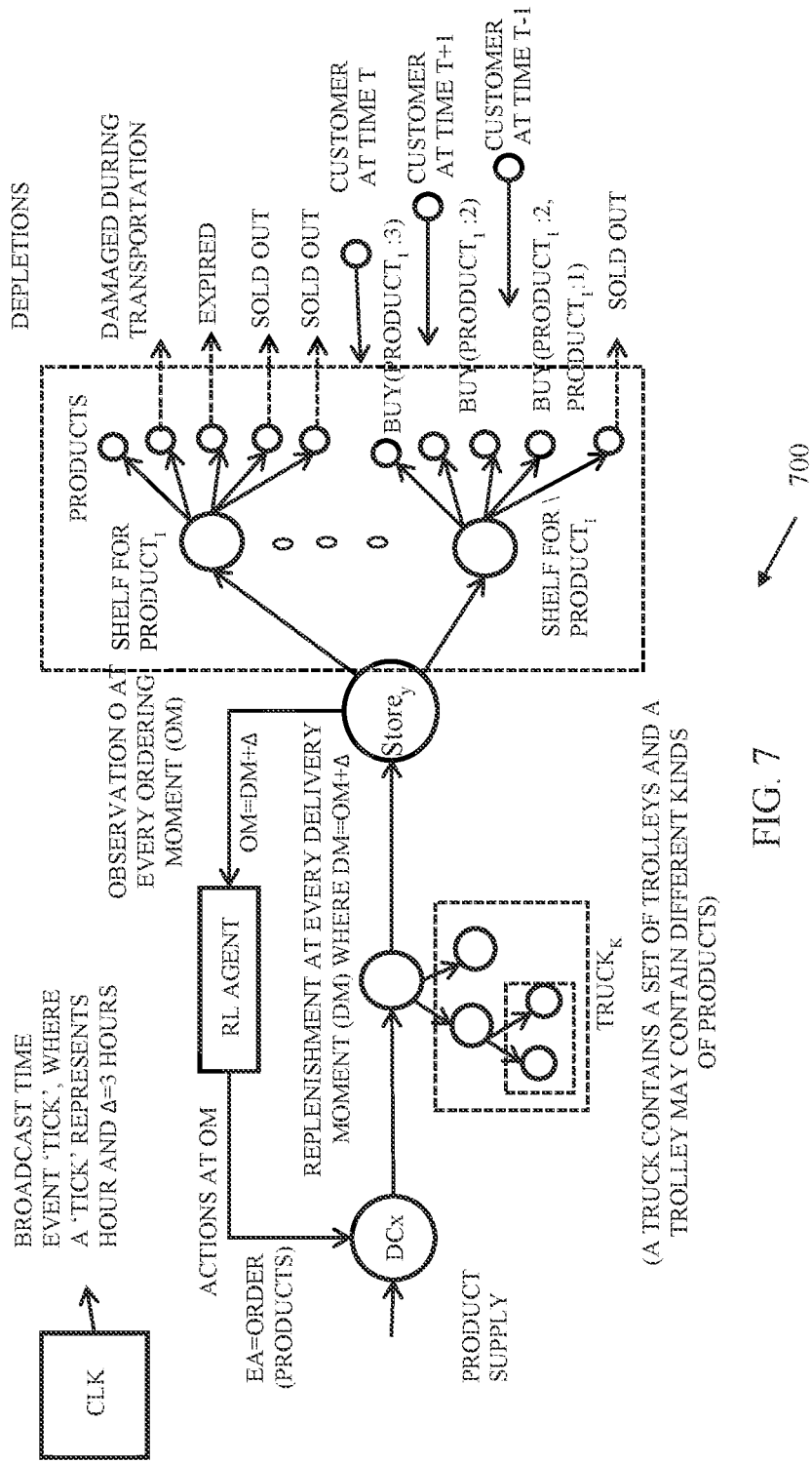
FIG. 7 illustrates an example representation of an actor abstraction model applied to a supply chain network, in accordance with an example embodiment of the present disclosure.

FIG. 7 illustrates an example representation of an actor abstraction model 700 applied to a supply chain network, in accordance with an example embodiment of the present disclosure. Herein, the supply chain network 600 (presented in FIG. 6A) is considered as an illustrator of a complex system as it comprises multiple interconnected subsystems, such as warehouses, stores, trucks, and store shelves, and several individualistic elements, such as products, labors and customers. Each of these subsystem and element has its composition structure, behavior and state. For example, warehouses maintain the stocks of multiple products and consist of a set of trolleys, trucks and labors. From behavioral perspective, a warehouse receives orders from multiple stores at every ordering moments (OM), utilizes labors to pack the products into the trolleys (try to use labors optimally to pack and load all ordered products before delivery moment), and uses trucks to deliver trolleys to the respective stores at every delivery moment (DM). A truck picks up a fixed number of trolleys (if the trolleys are ready to dispatch before a DM based on its capacity (hence all ordered products are not guaranteed to deliver by next DM), follows a designated route and drops trolleys at stores (with or without any delay). On arrival of a truck, a store unloads products from trolleys and places them in designated shelves. Each store reports the stocks of all products at every ordering moments (OM) along with other reward related factors, such as wastage due product expiry, packaging, unavailability of products. Each product has its own state (e.g., damaged, expired, in store, sold, etc), which is largely dependent on spatio-temporal conditions (i.e., how it is packed while transportation, time taken to deliver, shelf life-span), customer arrival rate, availability of other related products, etc.

As is previously described, representing the macro-behaviors of a supply chain network with several such subsystems and elements using analytical expressions or simple algebraic formulae to accurately represent the transition function P is a challenge. Moreover, it is hard as the overall behavior emerges from multiple stochastic micro-behaviors of the subsystems, elements and their non-linear interactions. In order to overcome aforementioned challenges, an actor abstraction is disclosed (as described previously with reference to FIG. 5B) to model the presented supply chain network.

As shown in FIG. 7, all subsystems and elements are represented using Actors, where each actor has its own state, trace, and autonomous, self-organizing, adaptive and probabilistic behaviors. The actors may change their states based on time (e.g., product expiry), external events (e.g., on receipt of Order (Products)), and other spatio-temporal conditions (e.g., product packaging and transportation delays). The overall state emerges from multiple micro-behaviors and their interactions that include product order, damages, product expiry and order arrivals. The RL agent is trained to compute actions to maximize long-term rewards in emerging scenarios using the actor model simulation.

As an evaluation, the characteristics of the simulation and reinforcement learning framework are specified and initialized, using a data set spanning one year derived from a public source. A total of 220 products were chosen from the data set, and their meta-data (volume, weight, shelf-life which was not available in the original version) was input manually. A single store and a single truck was used for this case study, with the time between successive delivery moments set to 6 hours (leading to 4 DM per day). The lead time Δ was 3 hours. Forecasts were computed using a uniformly weighted 10-step trailing average for each product. The store capacity, truck volume and weight capacity, and labor counts were computed based on the order volumes seen in the data. The truck volume constraint is deliberately set such that the average order numbers would severely test the transportation capacity of the system. Specifically, the net transportation volume capacity per delivery moment was set to 75% of the average volume of products sold in a delivery moment. Every product type receives a reward at the end of each delivery moment, based on the remaining inventory level at this time and the amount of product wasted, as per equation (1). The initial normalized inventory level for each product is set to 0.5 at the start of each training 'episode', and the level below which penalty is imposed is set to ρ=0.25. Of the order data set, the first 225 days (900 delivery moments) were used for training, while the remaining 124 days (496 delivery moments) were retained for testing.

Figure 8A:
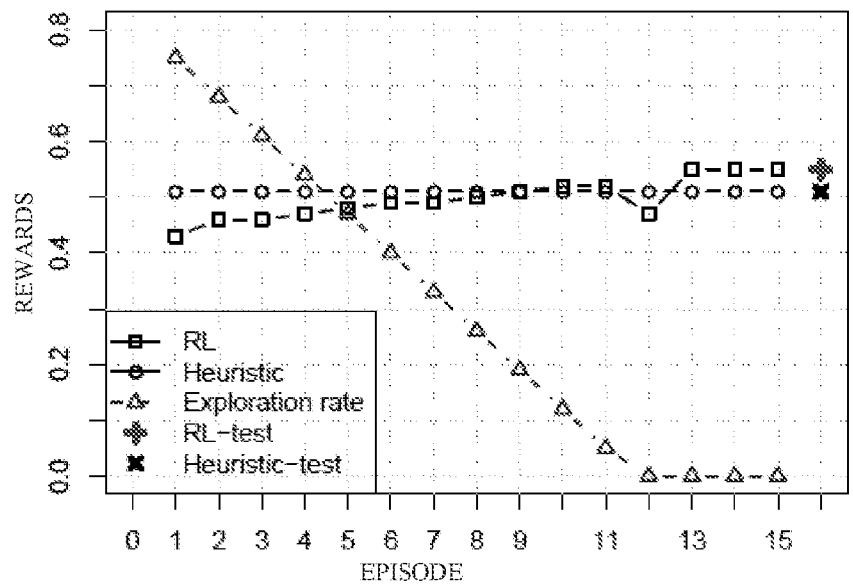
FIG. 8A illustrates a plot depicting training of the reinforcement learning algorithm in conjunction with the actor-based simulation, in accordance with an example embodiment of the present disclosure.

FIG. 8A illustrates a training of the reinforcement learning algorithm in conjunction with the actor-based simulation, over 15 episodes each spanning the 900 delivery moments from the training data set. The average reward, computed over all 220 products and all DM, is seen to increase as training proceeds. The reward is compared with a simplified version of an industry-standard replenishment heuristic, which aims to maintain the inventory levels of all products at a constant level (equal to the initial inventory level). It is seen that the reward at the end of the training exercise exceeds the heuristic performance, and this advantage is retained on the test data set as well (plotted using separate markers at the ends of the curves). Herein, 'exploration rate' of RL is the probability with which the RL algorithms take randomized actions (to explore the feature space). This rate is brought to zero towards the end of training, and is also zero for testing.

Figure 8B:
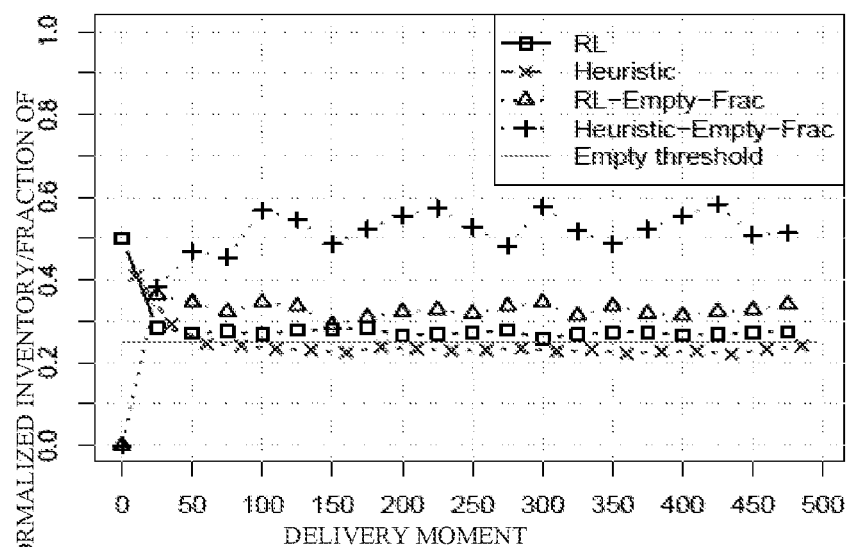
FIG. 8B illustrates a plot of inventory levels of products of FIG. 9A on test data set, in accordance with an example embodiment of the present disclosure.

The reason for the performance advantage of RL over the heuristic can be found in FIG. 8B, which plots the inventory levels of products on the test data set (496 delivery moments). Both algorithms begin with an initial (normalized) inventory level of 0.5 for all products. However, RL is able to maintain a higher average inventory level than the heuristic, by taking advantage of features such as the unit volumes and weights of individual products. Therefore, the fraction of products with inventory levels below $\rho=0.25$ is lower as well as more stable for RL.

Figure 9A:
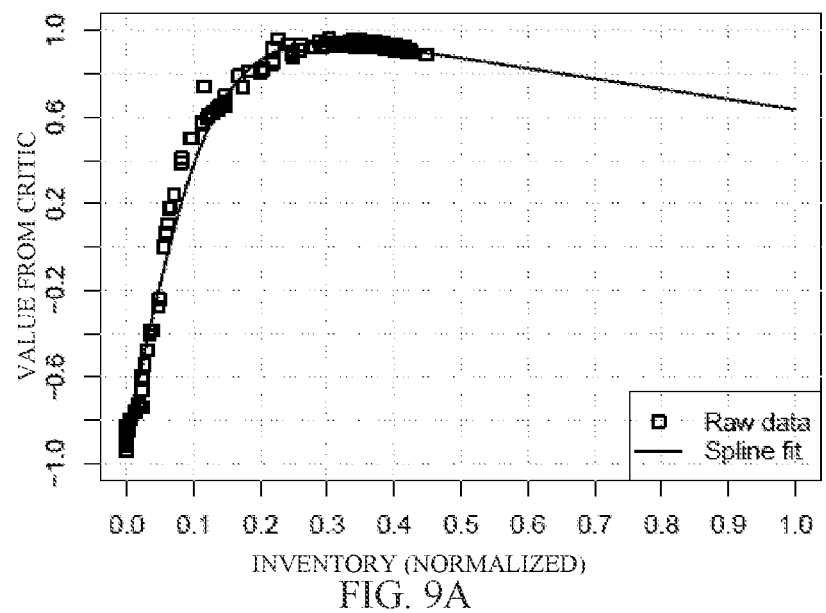
FIGS. 9A and 9B illustrate functional characteristics of RL Critics and Actor networks of RL agents of FIGS. 8A and 8B, in accordance with an example embodiment of the present disclosure.
Figure 9B:
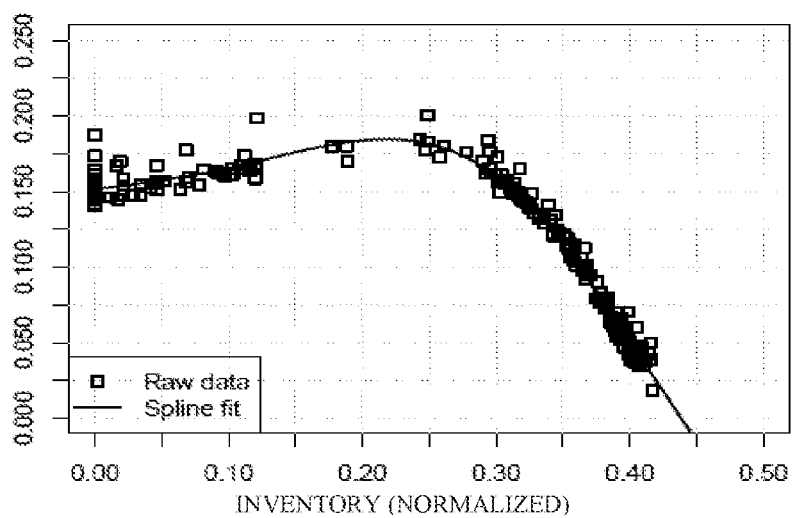

Finally, the functional characteristics of the Critic and Actor networks of the RL agents are illustrated in FIGS. 9A and 9B. The value attached by the Critic network is shown in FIG. 9A, as a function of the inventory level (after averaging over all other feature values). It is noted that the peak value is estimated to be close to an inventory level of 0.25, which corresponds to the penalty threshold $\rho$. The value drops quickly below this level. On the other hand, there is also a decrease in the estimated value at very high inventory levels. This property is likely due to the higher rates of product wastage in such states (higher inventory implies greater probability of products expiring while still unsold).

FIG. 9B shows the replenishment quantity requested by the Actor network, again as a function of the inventory level of the product after averaging over all other features. It is to be noted that the requested replenishment rises quickly as inventory levels drop from 0.5 towards the penalty threshold of 0.25. A majority of data points are located in the range between 0.3 and 0.4, where (i) the rate of wastage is lower than higher inventory levels, (ii) there is no penalty for dropping below p, and (iii) there is a small buffer for handling variability of sales between the ordering moment and the actual delivery moment. The requested replenishment decreases as inventory further reduces to 0, probably because the products have a low probability of recovery due to the severe transportation constraints.

The written description describes the subject matter herein to enable any person skilled in the art to make and use the embodiments. The scope of the subject matter embodiments is defined by the claims and may include other modifications that occur to those skilled in the art. Such other modifications are intended to be within the scope of the claims if they have similar elements that do not differ from the literal language of the claims or if they include equivalent elements with insubstantial differences from the literal language of the claims.

FIG. 10 is a block diagram of an exemplary computer system 1001 for implementing embodiments consistent with the present disclosure. The computer system 1001 may be implemented in alone or in combination of components of the system 102 (FIG. 1). Variations of computer system 1001 may be used for implementing the devices included in this disclosure. Computer system 1001 may comprise a central processing unit ("CPU" or "hardware processor") 1002. The hardware processor 1002 may comprise at least one data processor for executing program components for executing user- or system-generated requests. The processor may include specialized processing units such as integrated system (bus) controllers, memory management control units, floating point units, graphics processing units, digital signal processing units, etc. The processor may include a microprocessor, such as AMD Athlon™, Duron™ or Opteron™, ARM's application, embedded or secure processors, IBM PowerPC™, Intel's Core, Itanium™, Xeon™, Celeron™ or other line of processors, etc. The processor 1002 may be implemented using mainframe, distributed processor, multi-core, parallel, grid, or other architectures. Some embodiments may utilize embedded technologies like application specific integrated circuits (ASICs), digital signal processors (DSPs), Field Programmable Gate Arrays (FPGAs), etc.

Processor 1002 may be disposed in communication with one or more input/output (I/O) devices via I/O interface 1003. The I/O interface 1003 may employ communication protocols/methods such as, without limitation, audio, analog, digital, monoaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.11 a/b/g/n/x, Bluetooth, cellular (e.g., code-division multiple access (CDMA), high-speed packet access (HSPA+), global system for mobile communications (GSM), long-term evolution (LTE), WiMax, or the like), etc.

Using the I/O interface 1003, the computer system 1001 may communicate with one or more I/O devices. For example, the input device 1004 may be an antenna, keyboard, mouse, joystick, (infrared) remote control, camera, card reader, fax machine, dongle, biometric reader, microphone, touch screen, touchpad, trackball, sensor (e.g., accelerometer, light sensor, GPS, gyroscope, proximity sensor, or the like), stylus, scanner, storage device, transceiver, video device/source, visors, etc.

Output device 1005 may be a printer, fax machine, video display (e.g., cathode ray tube (CRT), liquid crystal display (LCD), light-emitting diode (LED), plasma, or the like), audio speaker, etc. In some embodiments, a transceiver 1006 may be disposed in connection with the processor 1002. The transceiver may facilitate various types of wireless transmission or reception. For example, the transceiver may include an antenna operatively connected to a transceiver chip (e.g., Texas Instruments WiLink WL1283, Broadcom BCM4750IUB8, Infineon Technologies X-Gold 618-PMB9800, or the like), providing IEEE 802.11a/b/g/n, Bluetooth, FM, global positioning system (GPS), 2G/3G HSDPA/HSUPA communications, etc.

In some embodiments, the processor 1002 may be disposed in communication with a communication network 1008 via a network interface 1007. The network interface 1007 may communicate with the communication network 1008. The network interface may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. The communication network 1008 may include, without limitation, a direct interconnection, local area network (LAN), wide area network (WAN), wireless network (e.g., using Wireless Application Protocol), the Internet, etc. Using the network interface 1007 and the communication network 1008, the computer system 1001 may communicate with devices 1009 and 1010. These devices may include, without limitation, personal computer(s), server(s), fax machines, printers, scanners, various mobile devices such as cellular telephones, smartphones (e.g., Apple iPhone™, Blackberry™, Android™-based phones, etc.), tablet computers, eBook readers (Amazon Kindle™, Nook™, etc.), laptop computers, notebooks, gaming consoles (Microsoft Xbox™, Nintendo DS™, Sony PlayStation™, etc.), or the like. In some embodiments, the computer system 1001 may itself embody one or more of these devices.

In some embodiments, the processor 1002 may be disposed in communication with one or more memory devices (e.g., RAM 713, ROM 714, etc.) via a storage interface 1012. The storage interface may connect to memory devices including, without limitation, memory drives, removable disc drives, etc., employing connection protocols such as serial advanced technology attachment (SATA), integrated drive electronics (IDE), IEEE-1394, universal serial bus (USB), fiber channel, small computer systems interface (SCSI), etc. The memory drives may further include a drum, magnetic disc drive, magneto-optical drive, optical drive, redundant array of independent discs (RAID), solid-state memory devices, solid-state drives, etc. Variations of memory devices may be used for implementing, for example, any databases utilized in this disclosure.

The memory devices may store a collection of program or database components, including, without limitation, an operating system 1016, user interface application 1017, user/application data 1018 (e.g., any data variables or data records discussed in this disclosure), etc. The operating system 1016 may facilitate resource management and operation of the computer system 1001. Examples of operating systems include, without limitation, Apple Macintosh OS X, Unix, Unix-like system distributions (e.g., Berkeley Software Distribution (BSD), FreeBSD, NetBSD, OpenBSD, etc.), Linux distributions (e.g., Red Hat, Ubuntu, Kubuntu, etc.), IBM OS/2, Microsoft Windows (XP, Vista/7/8, etc.), Apple iOS, Google Android, Blackberry OS, or the like. User interface 1017 may facilitate display, execution, interaction, manipulation, or operation of program components through textual or graphical facilities. For example, user interfaces may provide computer interaction interface elements on a display system operatively connected to the computer system 1001, such as cursors, icons, check boxes, menus, scrollers, windows, widgets, etc. Graphical user interfaces (GUIs) may be employed, including, without limitation, Apple Macintosh operating systems' Aqua™ IBM™ OS/2, Microsoft Windows™ (e.g., Aero, Metro, etc.), Unix™ X-Windows, web interface libraries (e.g., ActiveX™, Java™, Javascript™, AJAX™, HTML™, Adobe Flash™, etc.), or the like.

In some embodiments, computer system 1001 may store user/application data 1018, such as the data, variables, records, etc. as described in this disclosure. Such databases may be implemented as fault-tolerant, relational, scalable, secure databases such as Oracle or Sybase. Alternatively, such databases may be implemented using standardized data structures, such as an array, hash, linked list, structured text file (e.g., XML), table, or as hand-oriented databases (e.g., using HandStore, Poet, Zope, etc.). Such databases may be consolidated or distributed, sometimes among the various computer systems discussed above in this disclosure. It is to be understood that the structure and operation of any computer or database component may be combined, consolidated, or distributed in any working combination.

Additionally, in some embodiments, the server, messaging and instructions transmitted or received may emanate from hardware, including operating system, and program code (i.e., application code) residing in a cloud implementation. Further, it should be noted that one or more of the systems and methods provided herein may be suitable for cloud-based implementation. For example, in some embodiments, some or all of the data used in the disclosed methods may be sourced from or stored on any cloud computing platform.

Various embodiments of the present disclosure provide a method and a system for actor-based simulation for training and policy evaluation of RL agent in a synthetic environment. The disclosed system provides an efficient learning framework with realistic model (as opposed to traditional/conventional aggregated analytical model) to control complex business systems. In an embodiment, a control framework that uses reinforcement learning and an actor-based simulation is presented for training and policy evaluation of RL agent in the synthetic environment. Said training using disclosed method and system is both feasible (in terms of computational time and expense) and effective (in terms of discrimination power between subtle differences in system behavior). The use of the proposed actor based simulation as an environment to understand the overall implication of multiple RL actions (produced for different parts of a network) and locally optimized solutions for subsystems in a global system context is a viable option. The disclosed system provides a closed-loop simulation and reinforcement learning framework that allows deployment of the trained RL agent on a real system with minimal subsequent adjustments. Given the complexity of the systems being modelled (for example, a retail supply chain as disclosed herein), simple conventional algebraic relationships cannot represent the operational characteristics closely enough to allow for subsequent deployment as a controller on real-world system.

It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g., any kind of computer like a server or a personal computer, or the like, or any combination thereof. The device may also include means which could be e.g., hardware means like e.g., an application-specific integrated circuit (ASIC), a field-programmable gate array (FPGA), or a combination of hardware and software means, e.g. an ASIC and an FPGA, or at least one microprocessor and at least one memory with software modules located therein. Thus, the means can include both hardware means and software means. The method embodiments described herein could be implemented in hardware and software. The device may also include software means. Alternatively, the embodiments may be implemented on different hardware devices, e.g., using a plurality of CPUs.

The embodiments herein can comprise hardware and software elements. The embodiments that are implemented in software include but are not limited to, firmware, resident software, microcode, etc. The functions performed by various modules described herein may be implemented in other modules or combinations of other modules. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items. It must also be noted that as used herein and in the appended claims, the singular forms "a," "an," and "the" include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated by the following claims.

The invention claimed is:

1. A processor implemented method, comprising:
modeling, via one or more hardware processors, a plurality of actors of a system having a plurality of subsystems using an actor abstraction of the system, the plurality of actors comprising a plurality of reinforcement learning (RL) agents embodied in the plurality of subsystems to execute a plurality of micro-level interactions amongst the plurality of subsystems, wherein each subsystem of the plurality of subsystems embodies a RL agent from amongst the plurality of RL agents,
wherein each actor of the plurality of actors include an interface as an identity, an inbox or message queue for communication or the micro-level interactions, and an encapsulated software unit containing actor's state, behavior and a set of execution threads,
wherein the plurality of micro-level interactions between the plurality of RL agents comprises changing of states of one or more actors of the plurality of actors, creating new actors, and the one or more actors of the plurality of actors interacting with other actors through asynchronous messages, and
wherein a canonical form of each actor of the plurality of actors is extended with a notion of trace including a sequence of information about state and events,
wherein each actor of the plurality of actors is a five tuple:

⟨S, εC, εP, Tr, B⟩ where,
S is a set of labels that represent the states of the actor,
εC is a finite set of events that the actor consumes,
εP is a finite set of events that the actor produces, where εC and εP are not disjoint set and are consumed within the actor,
Tr is a finite sequence of a tuple, where each tuple captures consumed event, corresponding state and produced event, and
B is a set of behavioral units;
simulating, by using the plurality of actors having the plurality of RL agents, a macro-behavior of the system based on an observation of the plurality of micro-level interactions performed by the plurality of RL-agents, via the one or more hardware processors; and
learning, by the plurality of RL agents, one or more optimal decisions pertaining to actions of the plurality of the RL agents embodied in the plurality of subsystems based on the macro-behavior of the subsystem, via the one or more hardware processors.

2. The processor implemented method of claim 1, wherein modeling the plurality of actors of the system further comprises representing each subsystem of the plurality of subsystems as the plurality of actors, and wherein each actor of the plurality of actors comprises autonomous, self-organizing, and probabilistic micro-behaviors.

3. The processor implemented method of claim 1, wherein the changing of the state of the one or more subsystems of the plurality of subsystems represented as the plurality of actors is based on one or more of spatio-temporal conditions of the one or more subsystems.

4. The processor implemented method of claim 3, wherein simulating the emergent macro-behavior of the system comprises:
predicting, by using the actor abstraction of the system, subsequent states and subsequent rewards of the plurality of actors to obtain predicted states and predicted rewards, wherein a reward is a function of previous actions and an evolution of states; and
computing a transition mapping from control actions and current states of the plurality of actors to the predicted states and the predicted rewards that maximizes future discounted reward.

5. A system, comprising:
one or more memories; and
one or more hardware processors, the one or more memories coupled to the one or more hardware processors, wherein the one or more hardware processors are configured to execute programmed instructions stored in the one or more memories to model a plurality of actors of a system having a plurality of subsystems using an actor abstraction of the system, the plurality of actor comprising a plurality of reinforcement learning (RL) agents embodied in the plurality of subsystems to execute a plurality of micro-level interactions amongst the plurality of subsystems, wherein each subsystem of the plurality of subsystems embodies a RL agent from amongst the plurality of RL agents, wherein each actor of the plurality of actors include an interface as an identity, an inbox or message queue for communication or the micro-level interactions, and an encapsulated software unit containing actor's state, behavior and a set of execution threads, wherein the plurality of micro-level interactions between the plurality of RL agents comprises changing of states of one or more actors of the plurality of actors, creating new actors, and the one or more actors of the plurality of actors interacting with other actors through asynchronous messages, and wherein a canonical form of each actor of the plurality of actors is extended with a notion of trace including a sequence of information about state and events, wherein each actor of the plurality of actors is a five tuple:

⟨S, εC, εP, Tr, B⟩ where,

S is a set of labels that represent the states of the actor,

εC is a finite set of events that the actor consumes,

εP is a finite set of events that the actor produces, where εC and εP are not disjoint set and are consumed within the actor, Tr is a finite sequence of a tuple, where each tuple captures consumed event, corresponding state and produced event, and B is a set of behavioral units;

simulate, by using the plurality of actors having the plurality of RL agents, a macro-behavior of the system based on an observation of the plurality of micro-level interactions performed by the plurality of RL-agents; and learn, by the plurality of RL agents, one or more optimal decisions pertaining to actions of the plurality of the RL agents embodied in the plurality of subsystems based on the macro-behavior of the subsystem.

6. The system of claim 5, wherein the one or more hardware processors are configured by the instructions to model the plurality of actors of the system by representing each subsystem of the plurality of subsystems as the plurality of actors, and wherein each actor of the plurality of actors comprises autonomous, self-organizing, and probabilistic micro-behaviors.

7. The system of claim 5, wherein changing the state of the one or more subsystems of the plurality of subsystems represented as the plurality of actors is based on one or more of spatio-temporal conditions of the one or more subsystems.

8. The system of claim 7, wherein to simulate the emergent macro-behavior of the system, the hardware processors are configured by the instructions to:

predict, by using the actor abstraction of the system, subsequent states and subsequent rewards of the plurality of actors to obtain predicted states and predicted rewards, wherein a reward is a function of previous actions and an evolution of states; and compute a transition mapping from control actions and current states of the plurality of actors to the predicted states and the predicted rewards that maximizes future discounted reward.

9. A computer program product comprising a non-transitory computer readable medium having a computer readable program embodied therein, wherein the computer readable program, when executed on a computing device, causes the computing device to:

model, via one or more hardware processors, a plurality of actors of a system having a plurality of subsystems using an actor abstraction of the system, the plurality of actors comprising a plurality of reinforcement learning (RL) agents embodied in the plurality of subsystems to execute a plurality of micro-level interactions amongst the plurality of subsystems, wherein each subsystem of the plurality of subsystems embodies a RL agent from amongst the plurality of RL agents, wherein the actor abstraction of the system is modelled for training the plurality of RL agents, wherein each actor of the plurality of actors include an interface as an identity, an inbox or message queue for communication or the micro-level interactions, and an encapsulated software unit containing actor's state, behavior and a set of execution threads, wherein the plurality of micro-level interactions between the plurality of RL agents comprises changing of states of one or more actors of the plurality of actors, creating new actors, and the one or more actors of the plurality of actors interacting with other actors through asynchronous messages, and wherein a canonical form of each actor of the plurality of actors is extended with a notion of trace including a sequence of information about state and events, wherein each actor of the plurality of actors is a five tuple:

⟨S, εC, εP, Tr, B⟩ where,

S is a set of labels that represent the states of the actor,

εC is a finite set of events that the actor consumes,

εP is a finite set of events that the actor produces, where εC and εP are not disjoint set and are consumed within the actor, Tr is a finite sequence of a tuple, where each tuple captures consumed event, corresponding state and produced event, and B is a set of behavioral units;

simulate, by using the plurality of actors having the plurality of RL agents, a macro-behavior of the system based on an observation of the plurality of micro-level interactions performed by the plurality of RL-agents, via the one or more hardware processors; and learn, by the plurality of RL agents, one or more optimal decisions pertaining to actions of the plurality of the RL agents embodied in the plurality of subsystems based on the macro-behavior of the subsystem, via the one or more hardware processors.

10. The computer program product comprising a non-transitory computer readable medium as claimed in claim 9, wherein modeling the plurality of actors of the system further comprises representing each subsystem of the plurality of subsystems as the plurality of actors, and wherein each actor of the plurality of actors comprises autonomous, self-organizing, and probabilistic micro-behaviors.

11. The computer program product comprising a non-transitory computer readable medium as claimed in claim 9, wherein the changing of the state of the one or more subsystems of the plurality of subsystems represented as the plurality of actors is based on one or more of spatio-temporal conditions of the one or more subsystems.

12. The computer program product comprising a non-transitory computer readable medium as claimed in claim 11, wherein simulating the emergent macro-behavior of the system comprises:

predicting, by using the actor abstraction of the system, subsequent states and subsequent rewards of the plurality of actors to obtain predicted states and predicted rewards, wherein a reward is a function of previous actions and an evolution of states; and computing a transition mapping from control actions and current states of the plurality of actors to the predicted states and the predicted rewards that maximizes future discounted reward.

* * * * *